US011644500B2

(12) United States Patent
Ghouse et al.

(10) Patent No.: US 11,644,500 B2
(45) Date of Patent: May 9, 2023

(54) ADJUSTABLE ANCHOR FOR PRINTED CIRCUIT BOARD ENVIRONMENTAL SENSOR

(71) Applicant: Cisco Technology, Inc., San Jose, CA (US)

(72) Inventors: Mohammed Ghouse, Bengaluru (IN); Shailesh Nayak, Bangalore (IN); Damaruganath Pinjala, Bengaluru (IN); Rohit Dev Gupta, Bangalore (IN); Mehmet Onder Cap, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/480,773

(22) Filed: Sep. 21, 2021

(65) Prior Publication Data

US 2022/0018891 A1    Jan. 20, 2022

Related U.S. Application Data

(63) Continuation of application No. 16/229,717, filed on Dec. 21, 2018, now Pat. No. 11,255,897.

(30) Foreign Application Priority Data

Oct. 1, 2018  (IN) .............................. 201841036987

(51) Int. Cl.
*G01R 31/28*   (2006.01)
*H05K 1/02*    (2006.01)
*H05K 1/18*    (2006.01)

(52) U.S. Cl.
CPC ..... *G01R 31/2808* (2013.01); *G01R 31/2817* (2013.01); *H05K 1/0209* (2013.01); *H05K 1/181* (2013.01); *H05K 2201/064* (2013.01)

(58) Field of Classification Search
CPC ........ H05K 3/301; H05K 3/326; H05K 3/325; H05K 3/341; H05K 3/30; H05K 1/181;
(Continued)

(56) References Cited

U.S. PATENT DOCUMENTS 2,483,396 A    10/1949  Benson
3,886,560 A     5/1975  Mortensen et al.
(Continued)

FOREIGN PATENT DOCUMENTS

CN    204377250 U    6/2015
KR    20110133875 A  12/2011

OTHER PUBLICATIONS

Molex, "Vertical Solder Relief (VSR) Direct-Solder Crimp Terminals", www.molex.com/link/vsrterminals.html, Order No. 987651-3455, Aug. 2015, 2 pages.
(Continued)

*Primary Examiner* — Jermele M Hollington
*Assistant Examiner* — Courtney G McDonnough
(74) *Attorney, Agent, or Firm* — Edell, Shapiro & Finnan, LLC

(57)    ABSTRACT

In one example, a first tubular member has a first diameter and is configured to attach to a printed circuit board. A second tubular member has a second diameter different from the first diameter and is configured to hold an environmental
(Continued)

sensor for collecting data relating to an environment of the printed circuit board. The second tubular member is vertically adjustable relative to the first tubular member.

32 Claims, 14 Drawing Sheets

(58) Field of Classification Search
CPC ............ H05K 2201/064; H01R 12/712; H01R 12/7011; B29C 45/14; G01D 11/24; H01L 43/04; H02K 11/215; H02K 29/08; G01R 31/2808
USPC .............................. 324/750.19, 73; 438/736
See application file for complete search history.

(56) References Cited

U.S. PATENT DOCUMENTS

| | | | |
|---|---|---|---|
| 4,847,501 A | 7/1989 | Warner et al. | |
| 6,081,998 A * | 7/2000 | Terauchi | H05K 3/303 |
| | | | 29/842 |
| 6,619,556 B1 | 9/2003 | Snider et al. | |
| 8,836,354 B2 | 9/2014 | Dehkordi et al. | |
| 2002/0050915 A1 | 5/2002 | Riehl et al. | |
| 2003/0174412 A1 | 9/2003 | Noguchi | |
| 2009/0171513 A1 | 7/2009 | Tsukazawa | |
| 2016/0204481 A1 | 7/2016 | Ryu | |
| 2020/0333192 A1* | 10/2020 | Takase | G01K 1/16 |

OTHER PUBLICATIONS

Samiec, molex, "Product Specification Strain Relief Terminals", Document No. PS-4706-001, Jul. 2, 2010, 2 pages.
Soregan, molex, "90198 Strain Relief Terminal Product Specification", Document No. PS 90198, Jun. 9, 2017, 3 pages.
Aosong(Guangzhou) Electronics Co.,Ltd., "Temperature and humidity module DHT11 Product Manual", downloaded Oct. 30, 2018, 8 pages.
RS, "V9637. Pressure Transducers. Druckmeßwertgeber Anleitung. Transductores de presión. Trasduttori di pressione", Apr. 24, 2001, retrieved from https://docs-emea.rs-online.com/webdocs/034f/0900766b8034f18b.pdf, 5 pages.
Bosch, "BMP085 Preliminary data sheet", Order code: 0273300144, Feb. 19, 2008, 25 pages.
Central Semiconductor Corp., "NPN Silicon Transistor", Oct. 12, 2011, 3 pages.
Skumar07, molex, "Cabasy Temp Sensr Stckhlm 72-100923-01A0", Material No. 367680731, Sep. 14, 2017, 1 page.
International Search Report and Written Opinion in counterpart International Application No. PCT/US2019/053063, dated Jan. 7, 2020, 13 pages.

* cited by examiner

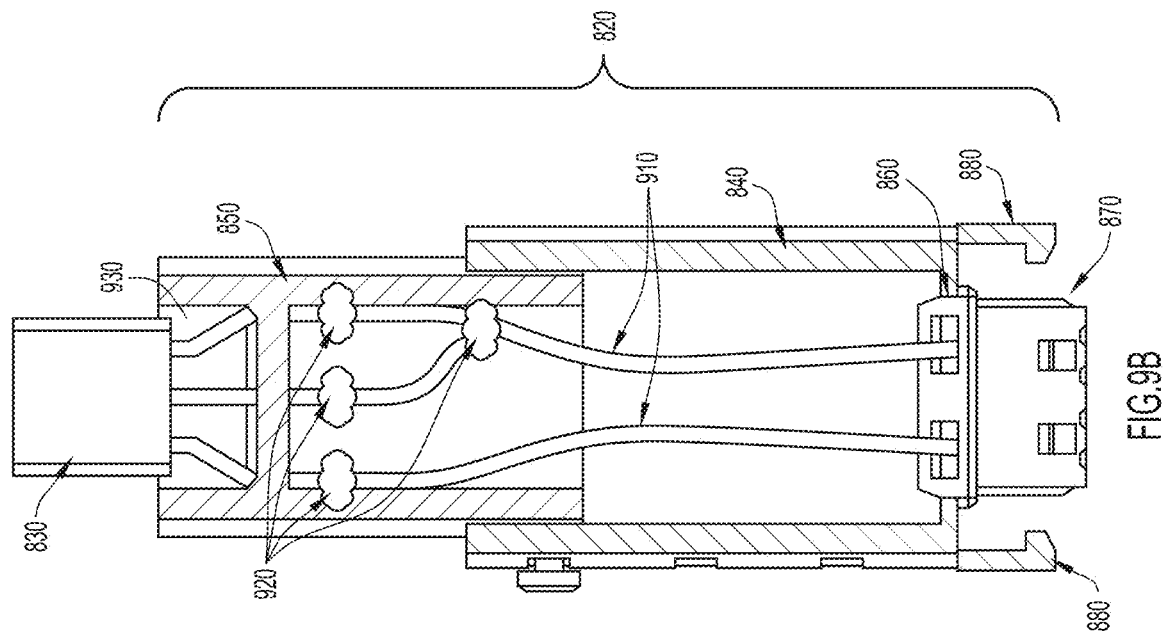
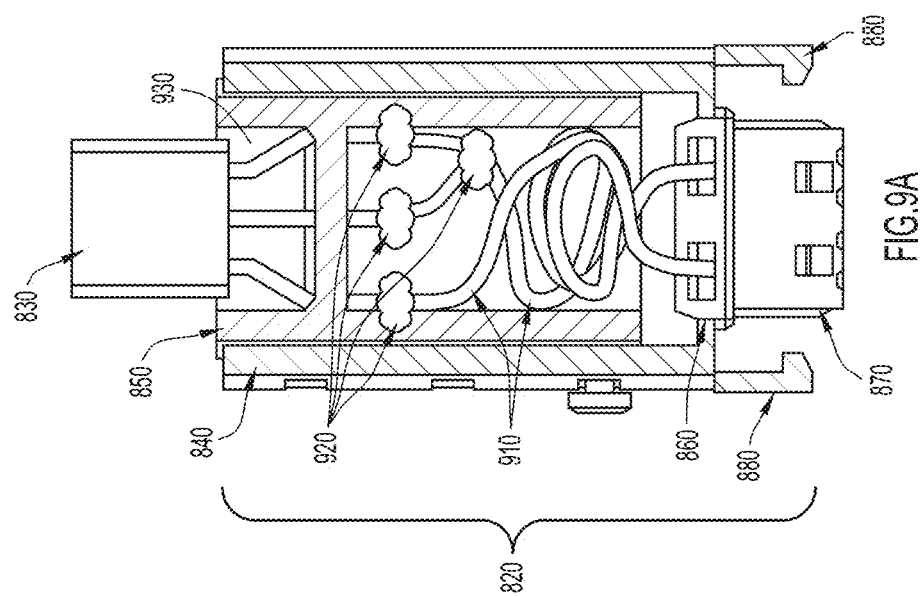

1300

1310 — ATTACH, TO AN ADJUSTABLE ANCHOR, AN ENVIRONMENTAL SENSOR FOR COLLECTING DATA RELATING TO AN ENVIRONMENT OF A PRINTED CIRCUIT BOARD, THE ADJUSTABLE ANCHOR INCLUDING A FIRST TUBULAR MEMBER HAVING A FIRST DIAMETER AND CONFIGURED TO ATTACH TO THE PRINTED CIRCUIT BOARD AND A SECOND TUBULAR MEMBER HAVING A SECOND DIAMETER DIFFERENT FROM THE FIRST DIAMETER AND CONFIGURED TO HOLD THE ENVIRONMENTAL SENSOR, WHEREIN THE SECOND TUBULAR MEMBER IS VERTICALLY ADJUSTABLE RELATIVE TO THE FIRST TUBULAR MEMBER

1320 — ATTACH THE ADJUSTABLE ANCHOR TO THE PRINTED CIRCUIT BOARD

FIG.13

ADJUSTABLE ANCHOR FOR PRINTED CIRCUIT BOARD ENVIRONMENTAL SENSOR

PRIORITY CLAIM

This application is a continuation of U.S. patent application Ser. No. 16/229,717, filed Dec. 21, 2018, which claims priority to Indian Provisional Application No. 201841036987, filed Oct. 1, 2018. The entirety of each of these applications is incorporated herein by reference.

TECHNICAL FIELD

The present disclosure relates to printed circuit boards (PCBs).

BACKGROUND

Environmental sensors are imperative for the proper functioning of printed circuit boards (PCBs). For example, temperature sensors attached to a PCB can be used to set the speed of one or more fans to maintain an operating temperature of the PCB. Accurate ambient temperature sensing is important for controlling fan speed for optimum performance. Running fans at optimum speed results in reduced fan power consumption, better user experience (e.g., reduction in acoustics noise), and increase in fan life expectancy (e.g., L10 life) without deteriorating reliability (e.g., system Mean Time Between Failures (MTBF)).

BRIEF DESCRIPTION OF THE DRAWINGS

FIGS. 9A and 9B illustrate a cross-section of the adjustable anchor of FIGS. 8A-8D, according to an example embodiment.

FIG. 13 is a flowchart of a method for attaching an adjustable anchor to a PCB, according to an example embodiment.

DESCRIPTION OF EXAMPLE EMBODIMENTS

Overview

In one example embodiment, an adjustable anchor is provided that includes a first tubular member having a first diameter and configured to attach to a printed circuit board. A second tubular member has a second diameter different from the first diameter and is configured to hold an environmental sensor for collecting data relating to an environment of the printed circuit board. The second tubular member is vertically adjustable relative to the first tubular member.

Example Embodiments

Typical environmental sensors are attached to printed circuit boards (PCBs) in a fixed manner, which can negatively impact the functioning of the PCB. For example, if a temperature sensor positioned too close to the PCB, the sensor may measure a temperature that is hotter than the true ambient temperature due to the heat of the PCB. Depending on the local air flow, the temperature sensor may provide a more accurate reading of the ambient temperature if the sensor were higher or lower. Moreover, optimal positioning for a temperature (or other environmental) sensor may vary among PCBs.

Failure to obtain an accurate reading of the ambient temperature can lead to numerous problems. Running the fans at unnecessarily high speeds can accelerate the accumulation of hygroscopic dust and increase the probability of corrosion failures. Meanwhile, running the fans at speed that are too low can cause the PCB to overheat. Current fixed ambient temperature sensing mechanisms are inaccurate and can call for significant thermal testing and software development to overcome their inaccuracies. Often, a software correction factor needs to be added to compensate for inaccurate thermal measurements. However, this does not work for all configurations/scenarios, resulting in false alarms in the field.

Accordingly, presented herein is an adjustable anchor to enable accurate environmental sensing. The adjustable anchor may eliminate tedious thermal (and/or other factors) testing and software development modules without significantly increasing production cost.

Figure 1:
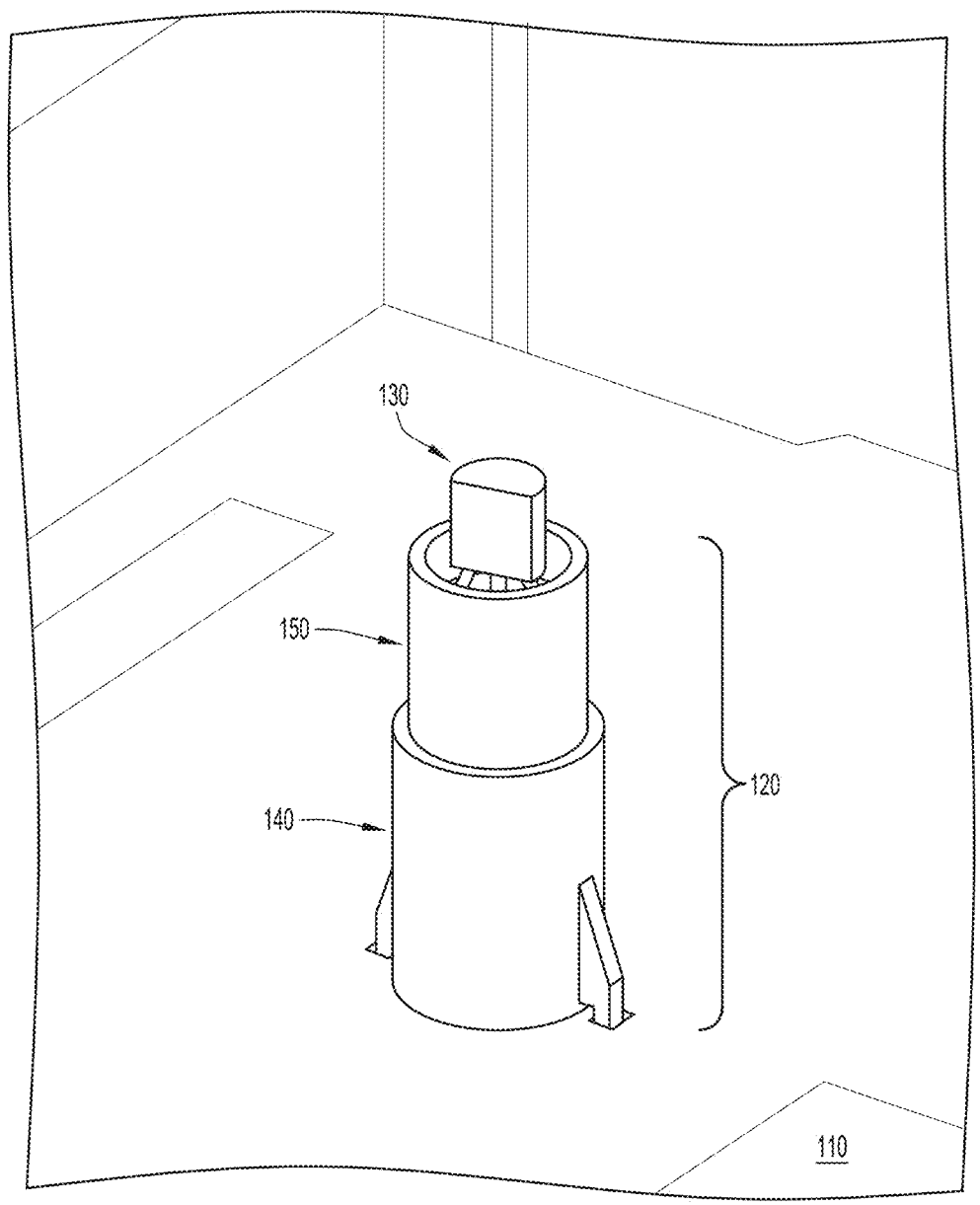
FIG. 1 illustrates a system including an adjustable anchor for an environmental sensor, according to an example embodiment.

With reference made to FIG. 1, shown is example system 100 configured to provide accurate environmental testing. System 100 includes PCB 110, adjustable anchor 120, and environmental sensor 130 (e.g., temperature sensor). Adjustable anchor 120 includes tubular members 140 and 150. Tubular member 140 is configured to attach to PCB 110. Tubular member 150 is vertically displaced above tubular member 140, and is configured to hold environmental sensor 130. Environmental sensor 130 may be configured to collect data relating to an environment of PCB 110 (e.g., ambient temperature data of the environment of PCB 110).

Tubular member 150 has a diameter that is different from the diameter of tubular member 140. In this example, the diameter of tubular member 140 is greater than the diameter of tubular member 150, although it will be appreciated that in other examples the diameter of tubular member 150 may be greater than the diameter of tubular member 140. Tubular member 150 is vertically adjustable relative to the tubular member 140. As such, environmental sensor 130 is vertically adjustable relative to PCB 110. Adjustable anchor 120 may be made of any suitable material(s), such as metal, plastic, non-conductive resin, or any combination thereof depending on the mechanical mounting and mechanism used for relative adjustments.

While FIG. 1 and the other figures subsequently described herein show that the tubular members are circular in cross-section, this is not meant to be limiting. The cross-section of the tubular members may be rectangular, triangular, or of any other desired shape. The term "diameter" as used herein may refer to any cross-sectional shape of the tubular members (e.g., circular, rectangular, triangular, etc.). Moreover, it will be appreciated that any suitable members, tubular or otherwise, may be utilized.

Figure 2:
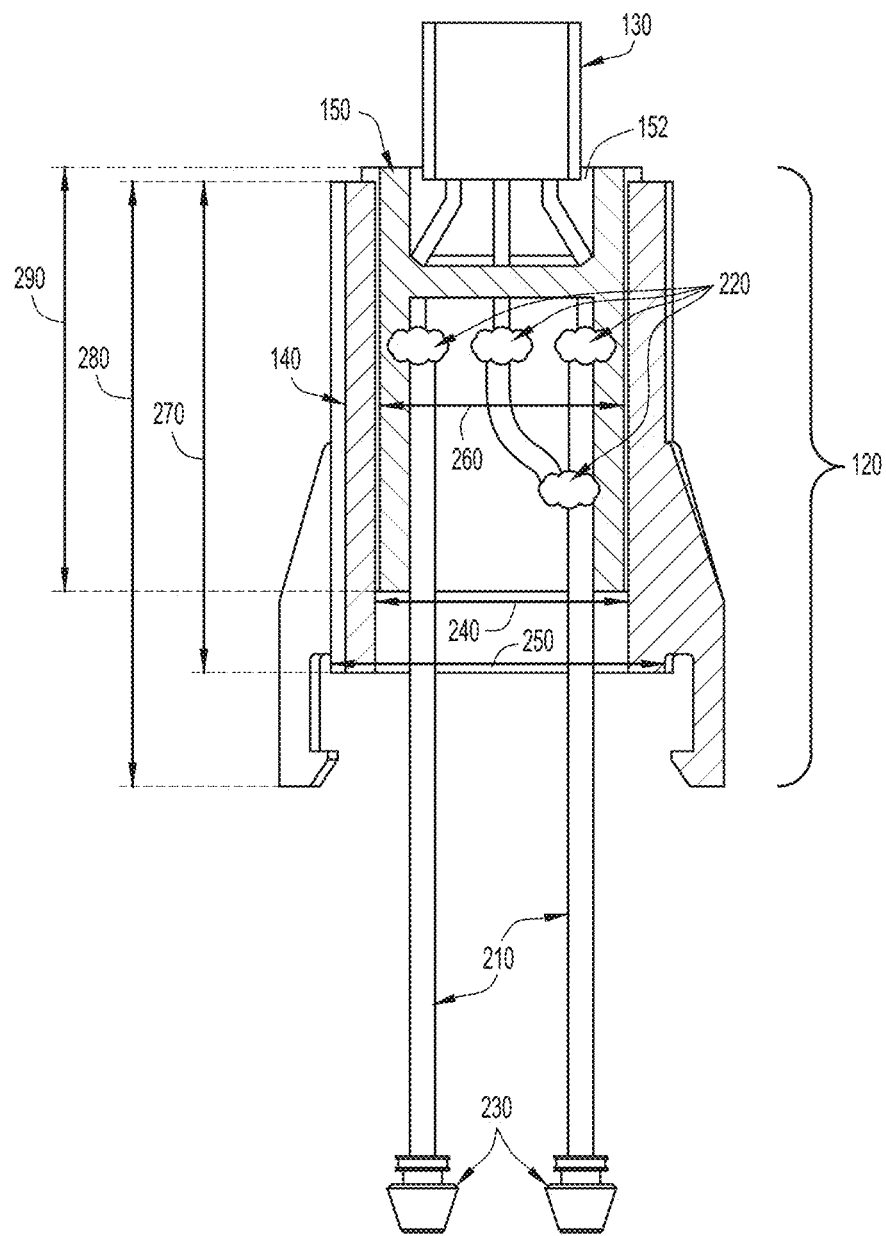
FIG. 2 illustrates a cross-section of the adjustable anchor of FIG. 1, according to an example embodiment.

FIG. 2 illustrates an example cross-section of adjustable anchor 120. As shown, tubular members 140 and 150 are configured to contain (insulated conductors) wires 210 coupled to environmental sensor 130. In one example, wires 210 are No. 26-30 American Wire Gauge (AWG) wires. Wires 210 may be coupled to environmental sensor 130 via lead soldering 220. Tubular member 150 may include a seating 152 to hold environmental sensor 130 such that there is minimal free movement of environmental sensor 130 during vibrations that could otherwise cause damage to lead soldering 220. Tubular members 140 and 150 may provide protection for lead soldering 220 by preventing exposure to environmental air, thereby minimize corrosion on lead soldering 220. PCB assembly crimp terminals 230 may be provided at the distal end of the wires 210. The crimp terminals 230 are configured to connect wires 210 to PCB 110 as shown in FIG. 1. Wires 210 enable environmental sensor 130 to transmit data (e.g., output signals) relating to an environment of PCB 110.

In one specific example, tubular member 140 has an inner diameter 240 of 0.346 inches and an outer diameter 250 of 0.413 inches, and tubular member 150 has an outer diameter 260 of 0.334 inches. Furthermore, a distance 270 from the top of tubular member 140 to the base of tubular member 140 may be 0.590 inches, a distance 280 from the top of tubular member 140 to the lowermost portion of tubular member 140 may be 0.791 inches. A distance 290 from the top of tubular member 150 to the base of tubular member 150 may be 0.511 inches.

Figure 3D:
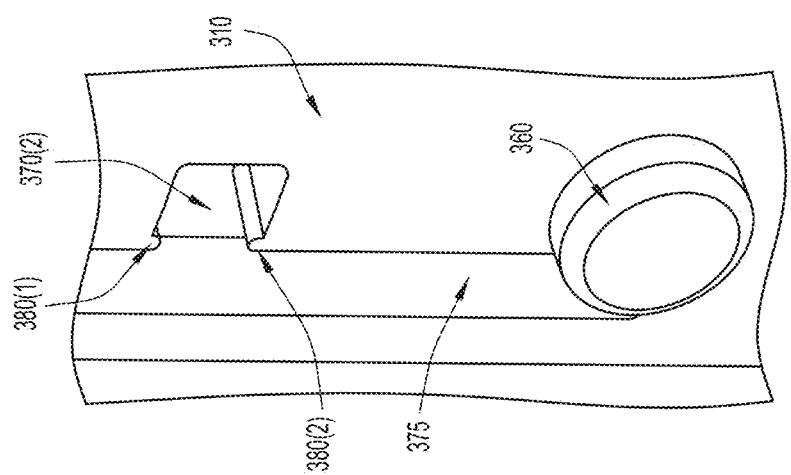
FIG. 3D illustrates an enlarged/close-up view of the locking mechanism, according to an example embodiment.
Figure 3C:
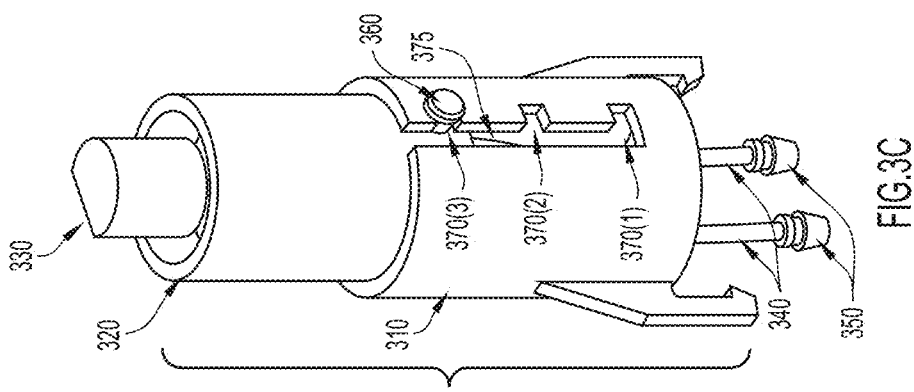
FIGS. 3A-3C illustrate a locking mechanism for an adjustable anchor in three vertical positions, according to an example embodiment.
Figure 3B:
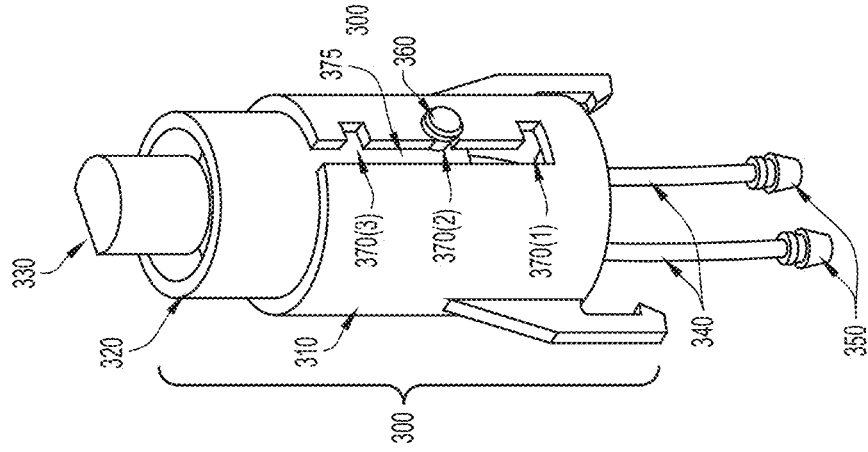
Figure 3A:
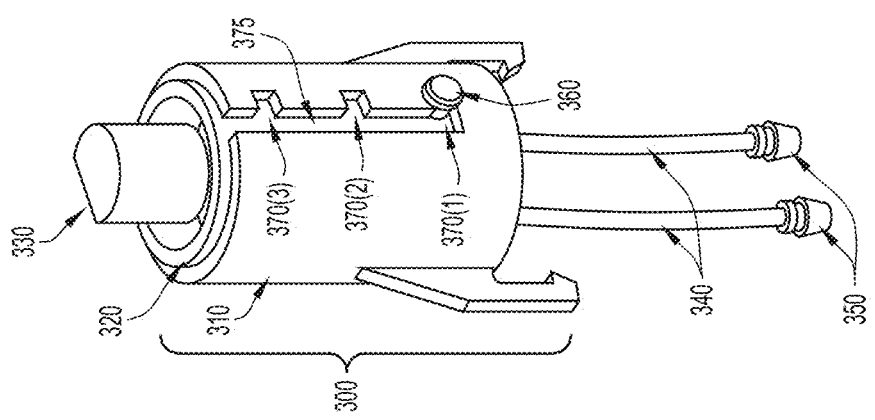

FIGS. 3A-3D illustrate an example locking mechanism for an adjustable anchor 300. With reference to FIGS. 3A-3C, adjustable anchor 300 includes tubular members 310 and 320. Tubular member 310 is configured to attach to a PCB, and tubular member 320 is vertically displaced above tubular member 310, and is configured to hold environmental sensor 330. Tubular members 310 and 320 are configured to contain wires 340 coupled to environmental sensor 330. Wires 340 also include PCB assembly crimp terminals 350, which are configured to connect wires 340 to the PCB.

Tubular member 320 includes knob 360, and tubular member 310 includes a plurality of slots 370(1)-370(3) and channel 375 that enable different vertically displaced locking positions of the anchor 300. Each slot 370(1)-370(3) is positioned vertically from the other slots and is configured to receive knob 360. In particular, slot 370(3) is positioned vertically above slot 370(2), and slot 370(2) is positioned vertically above slot 370(1). As shown in FIG. 3A, slot 370(1) receives knob 360, and since slot 370(1) is lowest on the tubular member 310, the vertical displacement between tubular members 310 and 320 is minimized. In FIG. 3B, slot 370(2) receives knob 360, and vertical displacement between tubular members 310 and 320 is at an intermediate level/amount such that tubular member 320 is at a positioned above tubular member 310. In FIG. 3C, slot 370(3) receives knob 360, and vertical displacement between tubular members 310 and 320 is at a highest position.

FIG. 3D illustrates a magnified view of slot 370(2) and is representative of the detail configuration of the slots 370(1)-370(3). In this example, slot 370(2) includes flanges 380(1) and 380(2) configured to secure knob 360. Flanges 380(1) and 380(2) may lock tubular member 320 at the intermediate vertical displacement position during operation, and may also prevent damage to environmental sensor 330 during handling, transportation, and/or operational shock/vibration. Slots 370(1) and 370(3) may also include flanges similar to that shown for slot 370(2). It will be appreciated that the profiles of the slots 370(1)-370(3) may be customized with additions or alternatives to their respective flanges.

While three slots 370(1)-370(3) are shown in the example of FIGS. 3A-3D, it will be appreciated that any suitable number of slots may be utilized. In one specific example, slots 370(1)-370(3) may each have a height of 0.047 inches. The width of channel 375 may also be 0.047 inches. Slot 370(2) may be vertically displaced from each of slots 370(1) and 370(3) by a distance of 0.177 inches. Furthermore, in an alternative example, the tubular member configured to attach to a PCB may include a knob, and the tubular member configured to hold the environmental sensor may include the plurality of slots.

Moreover, while the locking mechanism in the example of FIGS. 3A-3D involves knob 360 and a plurality of slots 370(1)-370(3), it will be appreciated that any suitable locking mechanism may be used to adjust the vertical displacement between tubular members. In one example, the tubular member configured to attach to a PCB may include a first helical thread, and the tubular member configured to hold the environmental sensor may include a second helical thread configured to mate with the first helical thread. Thus, vertical displacement between the tubular members may be adjusted by screwing one tubular member into (or out of) the other.

In another example, the tubular member configured to hold the environmental sensor may be configured to telescopically (e.g., frictionally) mate with the tubular member configured to attach to the PCB. Thus, vertical displacement between the tubular members may be adjusted by pushing (or pulling) one tubular member into (or out of) the other. The tubular member configured to hold the environmental sensor may be configured to be vertically adjustable relative to the tubular member configured to attach to the PCB manually (e.g., via a person's hands) or via a motor.

Figure 4:
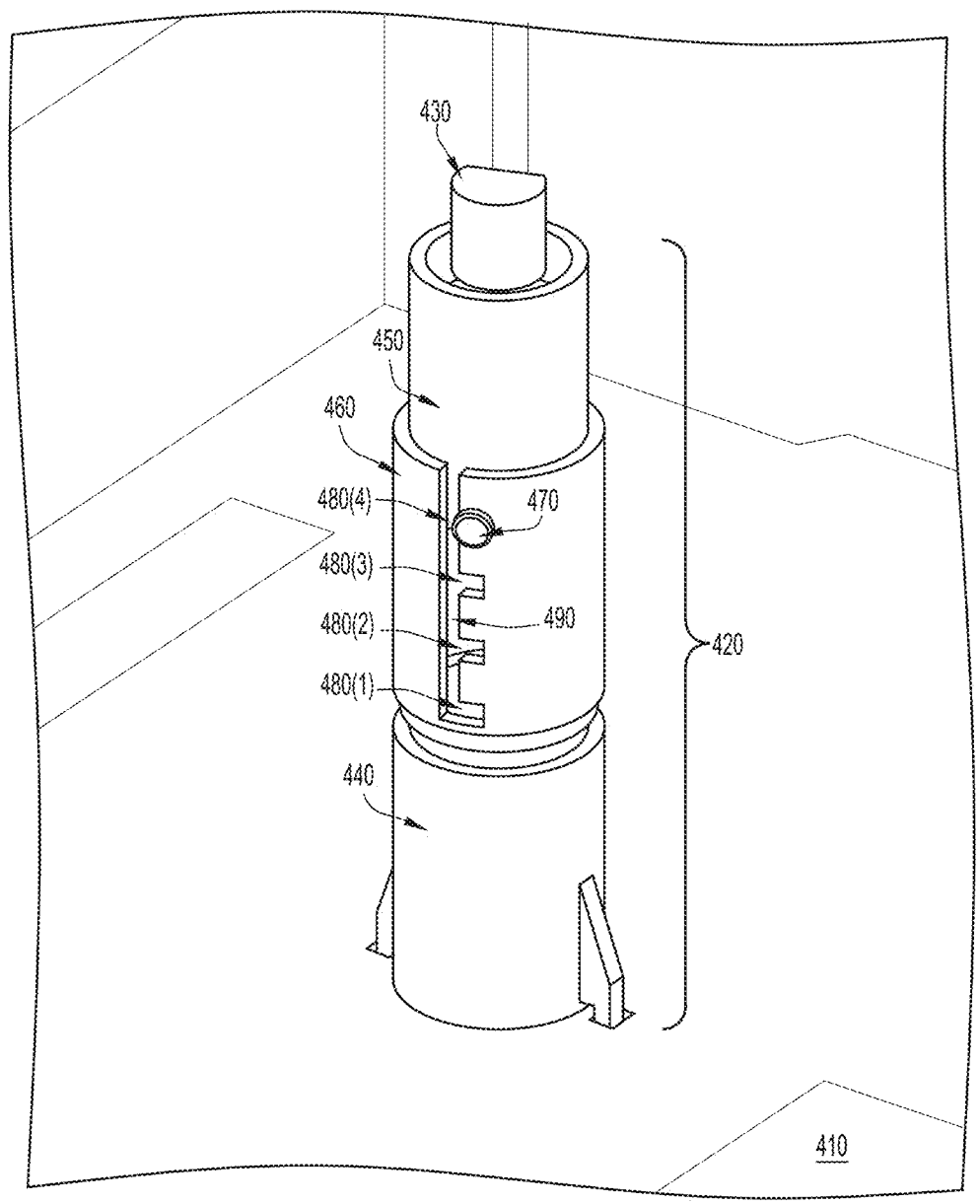
FIG. 4 illustrates a system including an adjustable anchor with further vertical displacement configurability, according to an example embodiment.

FIG. 4 illustrates example system 400 configured to provide accurate environmental testing. System 400 includes PCB 410, adjustable anchor 420, and environmental sensor 430. Adjustable anchor 420 includes tubular members 440 and 450. Tubular member 440 is configured to attach to PCB 410. Tubular member 450 is vertically displaced above tubular member 440, and is configured to hold environmental sensor 430. Adjustable anchor 420 further includes a third tubular member 460 vertically displaced above tubular member 440 and below tubular member 450. Tubular member 460 is configured to be vertically adjustable relative to at least one of tubular members 440 and 450. Tubular member 460 provides further vertical displacement configurability for adjustable anchor 420.

Tubular member 450 includes knob 470, and tubular member 460 includes a plurality of slots 480(1)-480(4) connected via channel 490. Each slot 480(1)-480(4) is positioned vertically from the other slots and is configured to receive knob 470. In particular, slot 480(4) is positioned vertically above slot 480(3), slot 480(3) is positioned vertically above slot 480(2), and slot 480(2) is positioned vertically above slot 480(1). When slot 480(1) receives knob 470, vertical displacement between tubular members 440 and 450 is minimized. When slot 480(2) receives knob 470, vertical displacement between tubular members 440 and 450 is greater than when slot 480(1) receives knob 470. When slot 480(3) receives knob 470, vertical displacement between tubular members 440 and 450 is greater than when slot 480(2) receives knob 470. As shown in FIG. 4, when slot 480(4) receives knob 470, vertical displacement between tubular members 440 and 450 is maximized. Slots 480(1)-480(4) may include respective flanges (as shown in FIG. 3D) configured to secure knob 470.

While four slots 480(1)-480(4) are shown in the example of FIG. 4, it will be appreciated that any suitable number of slots may be utilized. Furthermore, in an alternative example, the tubular member vertically displaced between the other tubular members may include a knob, and the tubular member configured to hold the environmental sensor may include the plurality of slots. Moreover, while the locking mechanism in the example of FIG. 4 involves knob 470 and a plurality of slots 480(1)-480(4), it will be appreciated that any suitable locking mechanism may be used to adjust the vertical displacement between tubular members (e.g., helical threads, telescopic mating, etc.) Vertical displacement may be adjusted manually or via a motor.

Figure 5A:
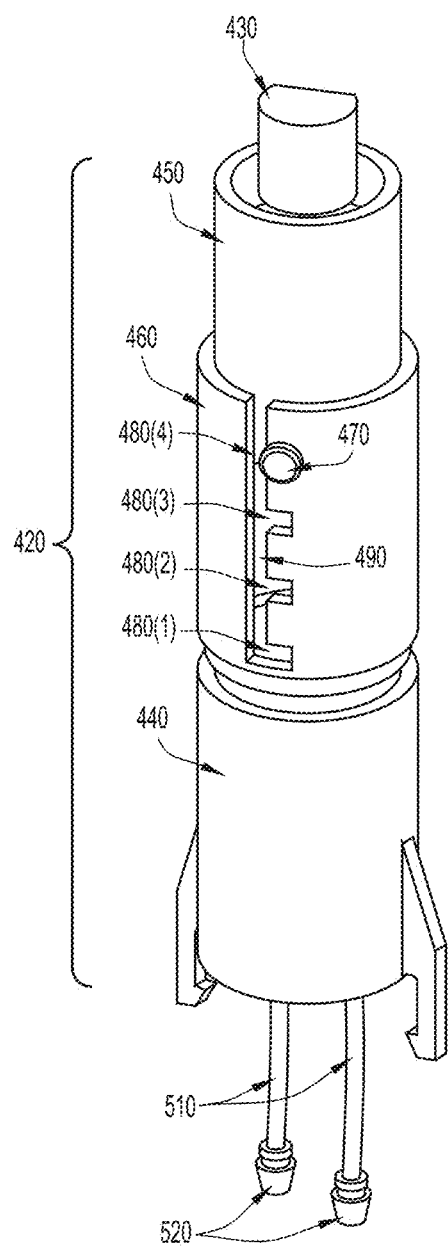
FIGS. 5A and 5B illustrate in more detail the adjustable anchor of FIG. 4, according to an example embodiment.
Figure 5B:
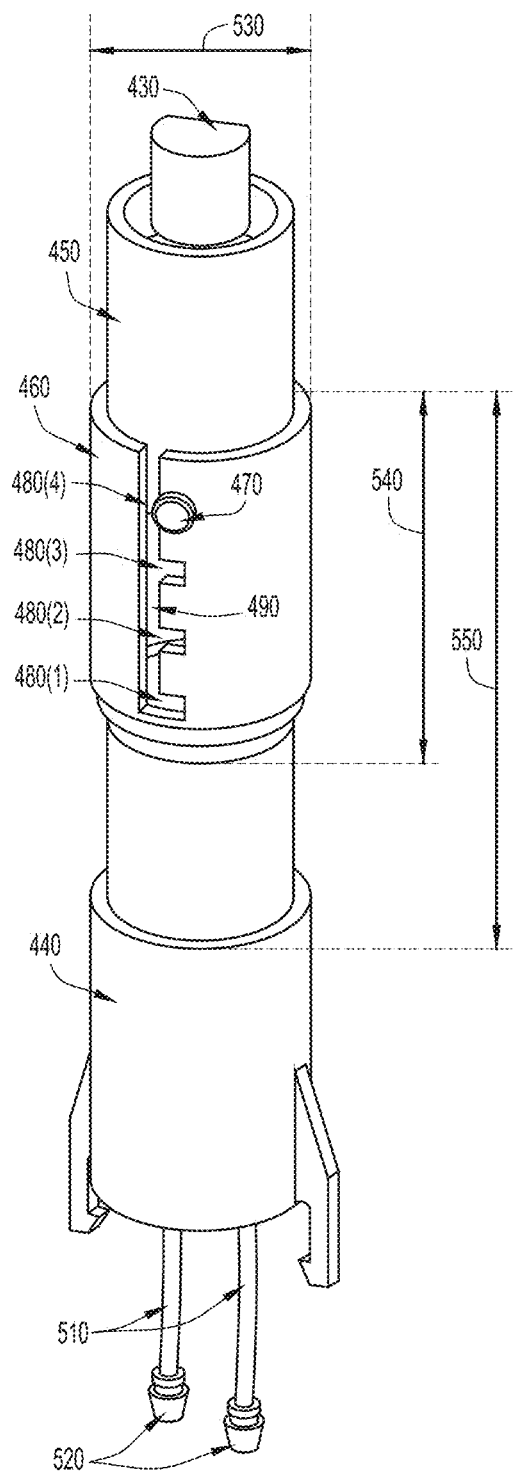

FIGS. 5A and 5B illustrate adjustable anchor 420 in more detail. Tubular members 440, 450, and 460 are configured to contain wires 510 coupled to environmental sensor 430. PCB assembly crimp terminals 520 are provided at the end of the wires 510 in order to connect wires 510 to the PCB. As shown in FIG. 5A, tubular member 460 is fully inserted (e.g., slid) into tubular member 440. In FIG. 5B, is partially removed from tubular member 440. In one specific example, the upper portion of tubular member 460 has an outer diameter 530 of 0.413 inches and a height 540 of 0.626 inches. The height 550 of tubular member 460 may be 1.118 inches. Slots 480(1)-480(4) and channel 490 may have identical or similar dimensions as slots 370(1)-370(3) and channel 375 (FIGS. 3A-3C).

In another example, a locking mechanism (e.g., knob-and-slots, helical threads, telescopic mating, etc.) may be provided to adjust the vertical displacement between the tubular member configured to attach to the PCB and tubular member vertically displaced between the other tubular members. In this example, vertical displacement may be adjusted between the tubular member configured to attach to the PCB and tubular member vertically displaced between the other tubular members, and/or between the tubular member vertically displaced between the other tubular members and the tubular member configured to hold the environmental sensor.

Figure 6C:
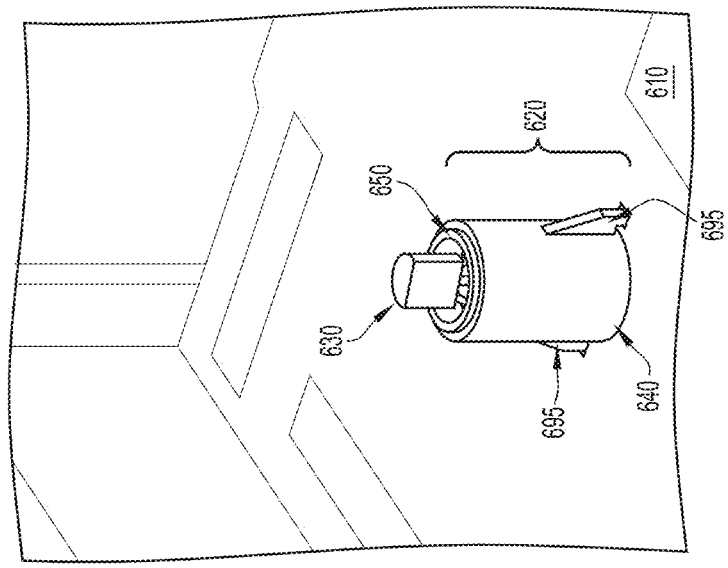
FIGS. 6A-6C illustrate a system in which an adjustable anchor is attached to a through-hole in a printed circuit board (PCB), according to an example embodiment.
Figure 6B:
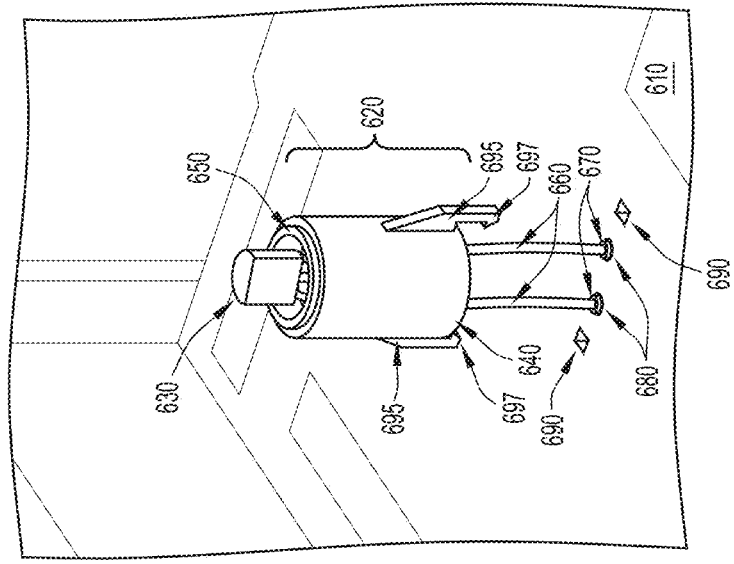
Figure 6A:
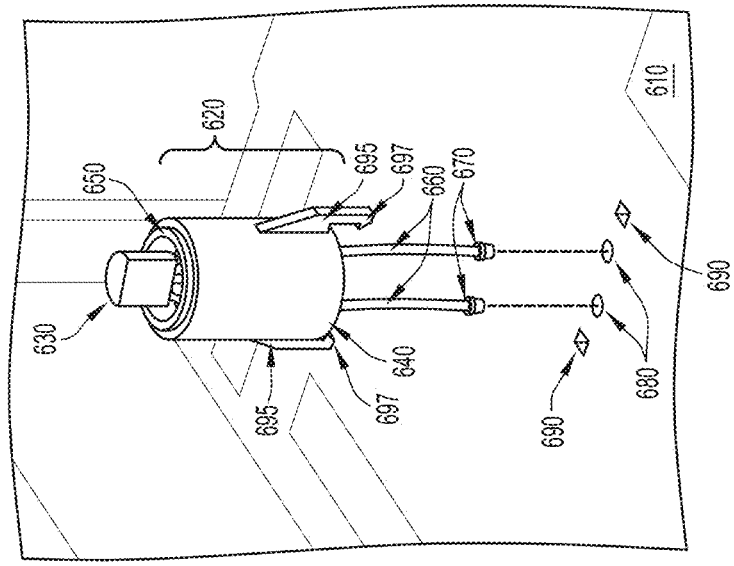

FIGS. 6A-6C illustrate an example system 600 including PCB 610, adjustable anchor 620, and environmental sensor 630. Adjustable anchor 620 includes tubular members 640 and 650. Tubular member 640 is configured to attach to PCB 610. Tubular member 650 is vertically displaced above tubular member 640, and is configured to hold environmental sensor 630. Tubular members 640 and 650 are configured to contain wires 660 coupled to environmental sensor 630. Wires 660 also include PCB assembly crimp terminals 670, which are configured to connect wires 660 to PCB 610. PCB 610 includes terminal holes 680 configured to accept crimp terminals 670. PCB 610 also includes through-holes 690 configured to accept/receive tubular member 640. In particular, tubular member 640 includes arms 695 configured to attach to through holes 690. Arms 695 include inward-facing hooks 697 that snap into through-holes 690 and secure adjustable anchor 620 to PCB 610.

FIGS. 6A-6C illustrate snapshots of stages during a process for attaching adjustable anchor 620 to through-holes 690 of the PCB 610. FIG. 6A illustrates a first stage when adjustable anchor 620 is placed above the PCB 610 and is ready to be attached to PCB 610. FIG. 6B illustrates a second stage during which crimp terminals 670 are attached to terminal holes 680. PCB 610 may be subjected to a wave soldering process to solder wires 660 at this time. FIG. 6C illustrates a third stage during which arms 695 snap into through holes 690. The arms 695 of tubular member 640 are attached to through-holes 690, thereby securing adjustable anchor 620 to PCB 610.

Figure 7A:
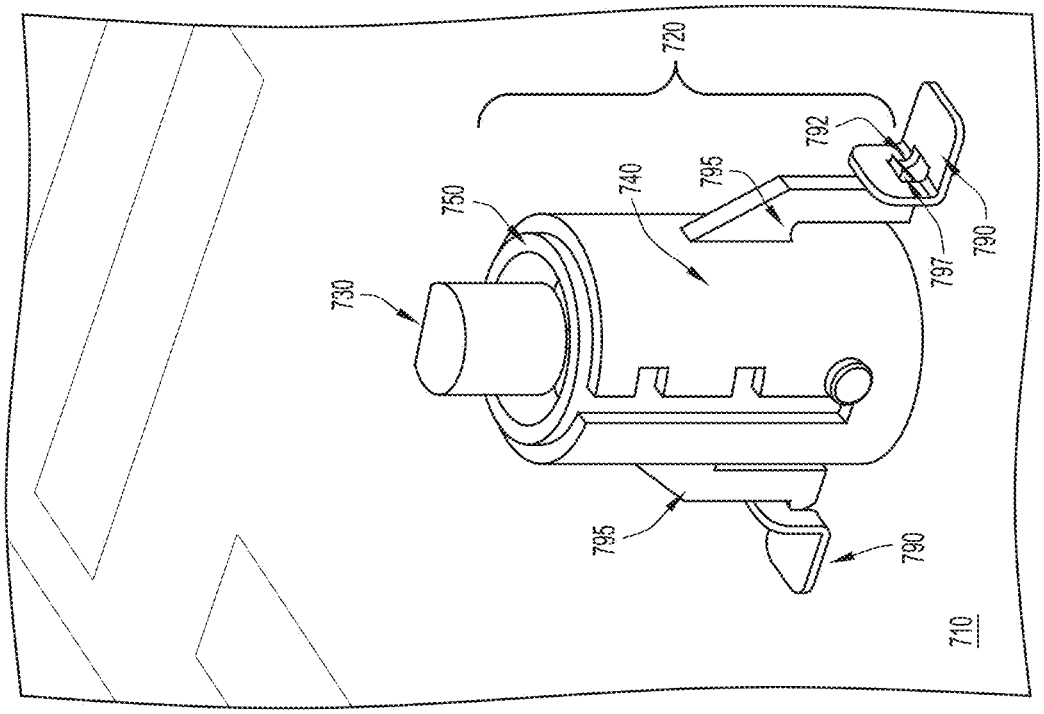
FIGS. 7A and 7B illustrate a system in which an adjustable anchor is attached to a first surface mount type on a PCB, according to an example embodiment.
Figure 7B:
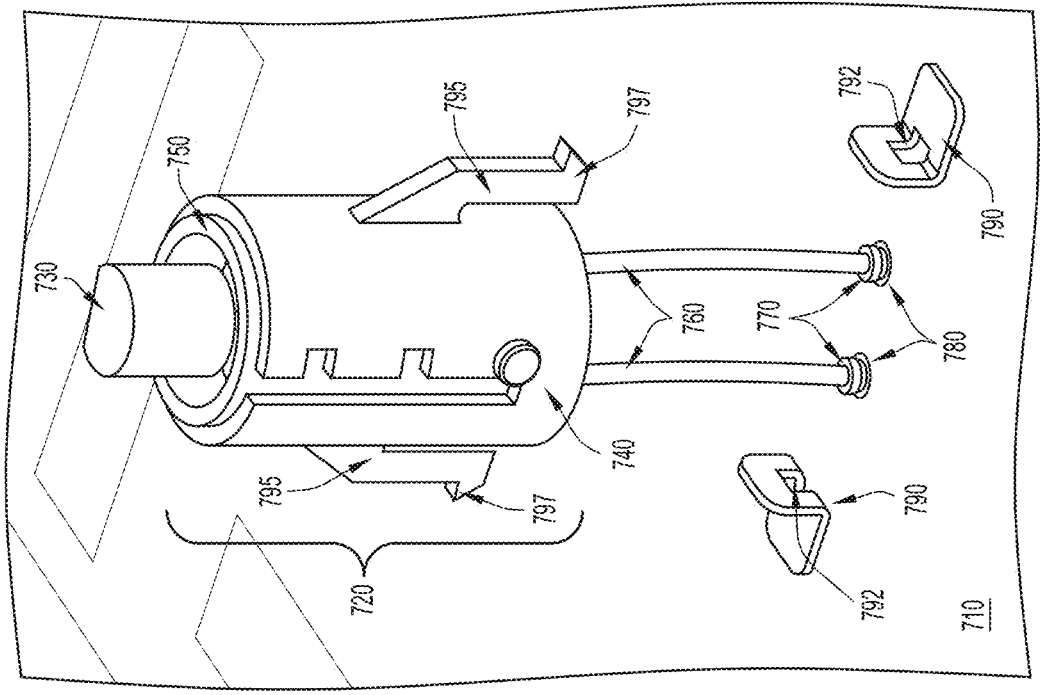

In an alternative example, the tubular member configured to attach to the PCB is configured to attach to a surface mount on the PCB. FIGS. 7A and 7B illustrate a first example of a tubular member configured to attach to a surface mount on the PCB, and FIGS. 8A-8D illustrate a second example of a tubular member configured to attach to a surface mount on the PCB.

FIGS. 7A and 7B illustrate an example system 700 including a first surface mount type. System 700 includes PCB 710, adjustable anchor 720, and environmental sensor 730. Adjustable anchor 720 includes tubular members 740 and 750. Tubular member 740 is configured to attach to PCB 710. Tubular member 750 is vertically displaced above tubular member 740, and is configured to hold environmental sensor 730. Tubular members 740 and 750 are configured to contain wires 760 coupled to environmental sensor 730. Wires 760 also include PCB assembly crimp terminals 770, which are configured to connect wires 760 to PCB 710. PCB 710 includes terminal holes 780 configured to accept crimp terminals 770. PCB 710 also includes tabs 790 configured to accept tubular member 740. Tabs 790 may be metal structures soldered to PCB 710, and tubular member 740 includes arms 795 configured to be inserted into holes 792 of tabs 790. In particular, arms 795 include outward-facing hooks 797 which snap into holes 792 of tabs 790 and secure adjustable anchor 720 to PCB 710.

FIGS. 7A and 7B illustrate stages of installation during which adjustable anchor 720 is attached to tabs 790. FIG. 7A illustrates a first stage during which crimp terminals 770 are attached to terminal holes 780. PCB 710 may be subjected to a wave soldering process to solder wires 760 during this stage. FIG. 7B illustrates a second stage during which arms 795 snap into tabs 790. Tubular member 740 is thus configured to attach to a surface mount (in the form of tabs 790) and secure adjustable anchor 720 to PCB 710. System 700 may avoid the need for creating through-holes in PCB 710, thereby improving routing in PCB 710 for improved signal integrity performance.

FIGS. 8A-8D illustrate an example system 800 including a second surface mount type. System 800 includes PCB 810, adjustable anchor 820, and environmental sensor 830. Adjustable anchor 820 includes tubular members 840 and 850. Tubular member 840 is configured to attach to PCB 810. Tubular member 850 is vertically displaced above tubular member 840, and is configured to hold environmental sensor 830. Tubular members 840 and 850 are configured to contain wires (not shown) coupled to environmental sensor 830. The wires (not shown) connect to female electrical connector 860. A male electrical connector 870 is mounted to the PCB 810 and configured to accept female electrical connector 860. The female electrical connector 860 may snap into male electrical connector 870 and thereby secure adjustable anchor 820 to PCB 810.

Figure 8B:
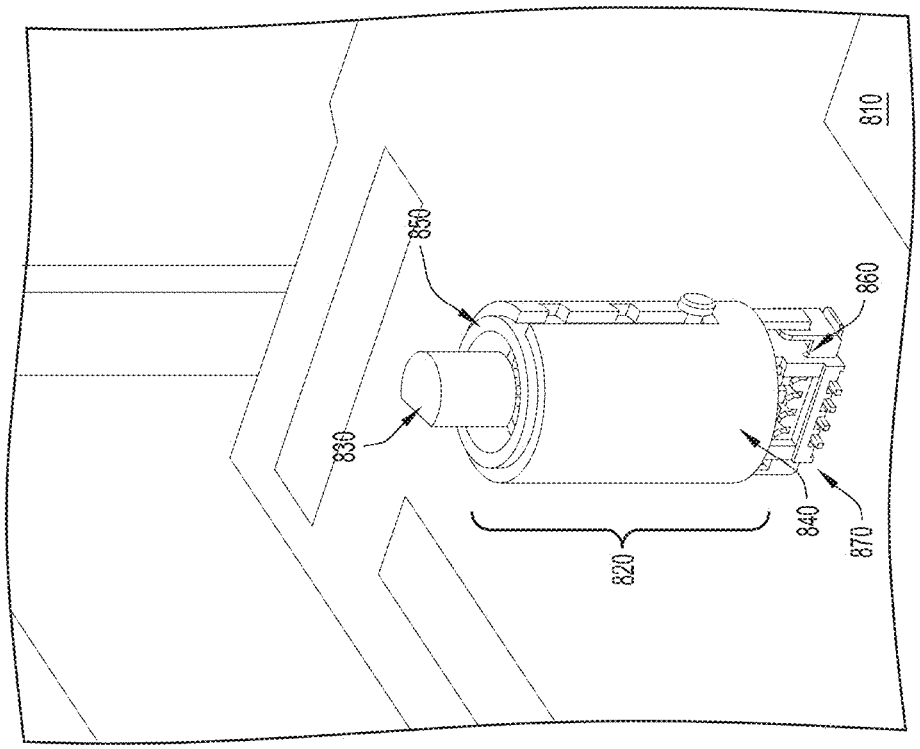
FIGS. 8A-8D illustrate a system in which an adjustable anchor is attached to a second surface mount type on a PCB, according to an example embodiment.
Figure 8A:
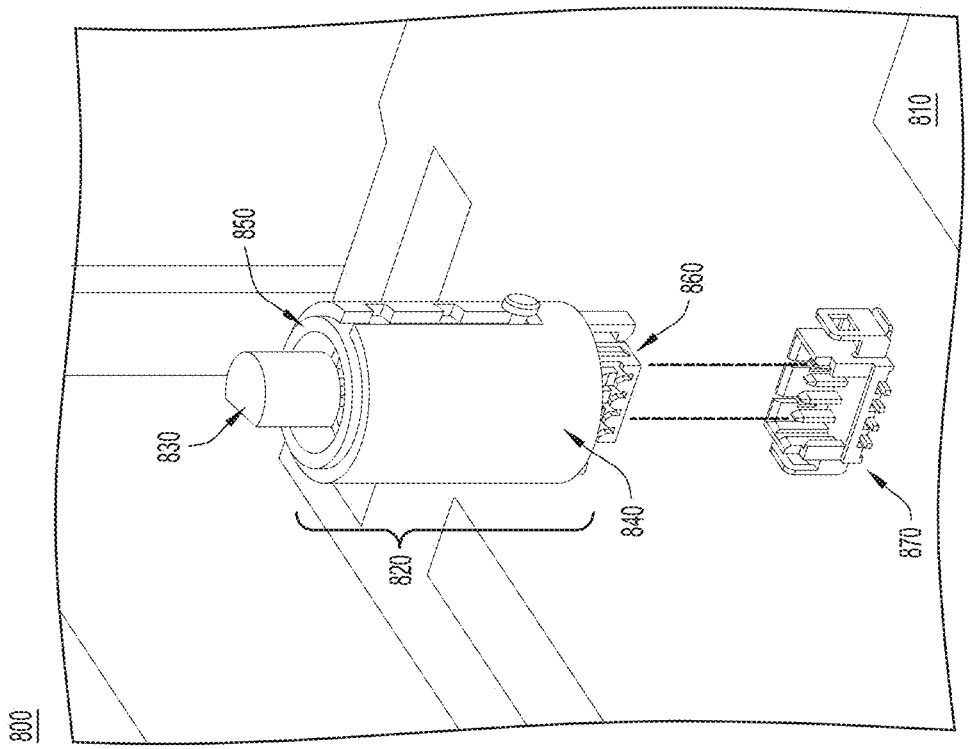
Figure 8D:
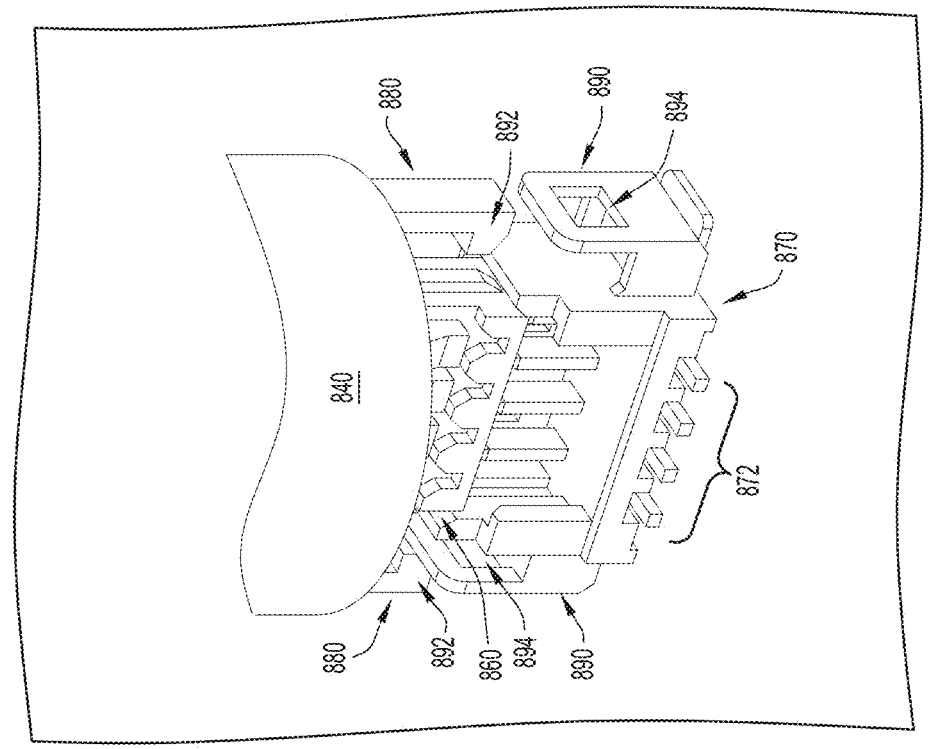
Figure 8C:
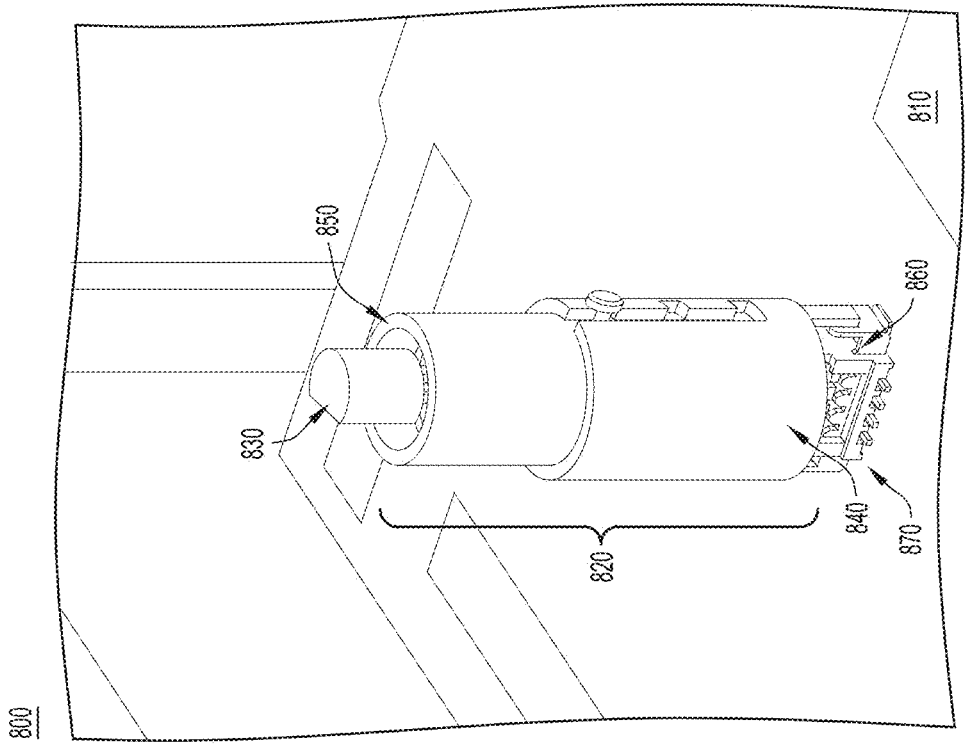

FIGS. 8A-8C illustrate stages during which adjustable anchor 820 is attached to male electrical connector 870. FIG. 8A illustrates a first stage during which adjustable anchor 820 is ready to be attached to male electrical connector 870. FIG. 8B illustrates a second stage during which adjustable anchor 820 is attached to male electrical connector 870. FIG. 8C illustrates a third stage during which tubular member 850 is vertically displaced above tubular member 840. Tubular member 840 is thus configured to attach to a surface mount (in the form of male electrical connector 870) and secure adjustable anchor 820 to PCB 810. The system 800 may avoid creating through-holes in PCB 810, and has the associated benefits described above in connection with FIGS. 7A and 7B.

FIG. 8D illustrates a magnified view of female electrical connector 860 and male electrical connector 870. As shown, male electrical connector 870 includes a plurality of pins 872 that are accepted by female electrical connector 860. Tubular member 840 includes arms 880 configured to attach to tabs 890 of male electrical connector 870. Arms 880 include inward-facing hooks 892 which snap into holes 894 of tabs 890 and thereby secure adjustable anchor 820 to PCB 810.

FIGS. 9A and 9B illustrate an example cross-section view of adjustable anchor 820. As shown, tubular members 840 and 850 are configured to contain wires 910 that connect to environmental sensor 830. Wires 910 may be coupled to environmental sensor 830 via lead soldering 920. Tubular member 850 may include seating 930 to hold environmental sensor 830 such that there is minimal free movement of environmental sensor 830 during vibrations that could otherwise cause damage to lead soldering 920. Wires 910 are connected to female electrical connector 860, which in turn is configured to connect wires 910 to PCB 810 (FIG. 8). Wires 910 enable environmental sensor 830 to output signals relating to an environment of PCB 810.

FIG. 9A illustrates a first configuration in which the vertical displacement of tubular member 850 is minimized. In the example of FIG. 9A, wires 910 are relatively slack. FIG. 9B illustrates a second configuration in which the vertical displacement of tubular member 850 is maximized. In the example of FIG. 9B, wires 910 are relatively taut.

Figure 10C:
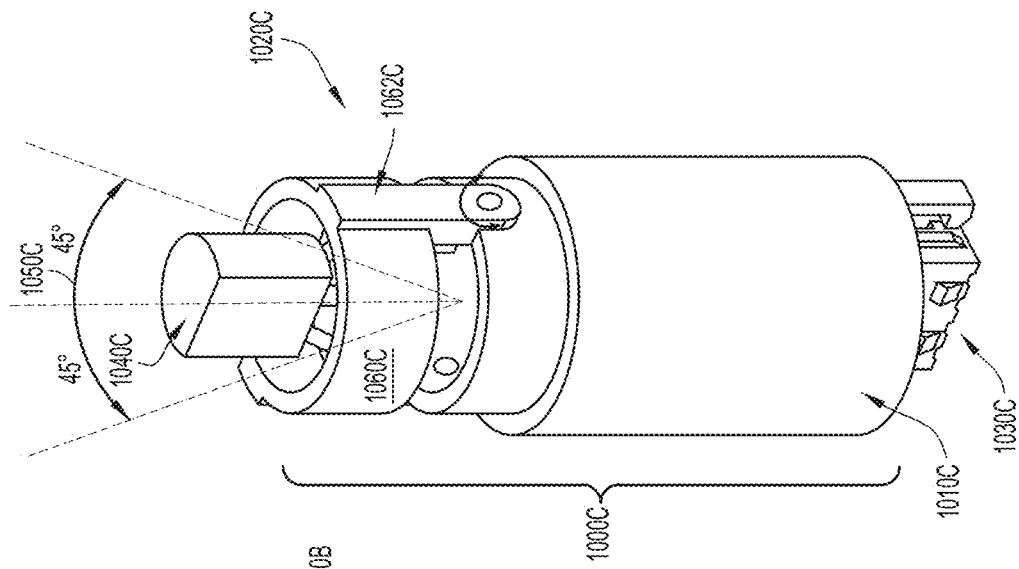
FIGS. 10A-10C illustrate respective adjustable anchors configured to enable various degrees of freedom for an environmental sensor, according to an example embodiment.
Figure 10B:
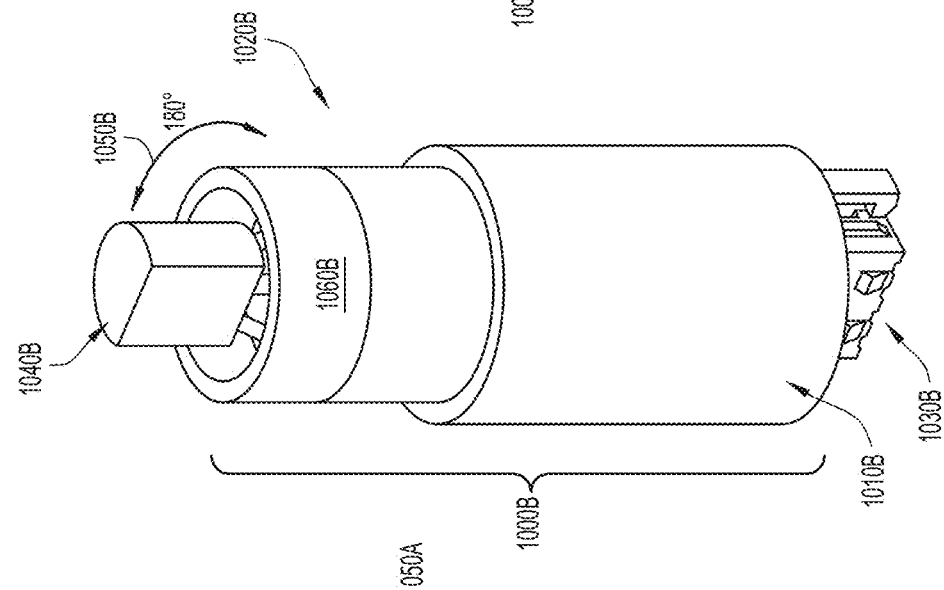
Figure 10A:
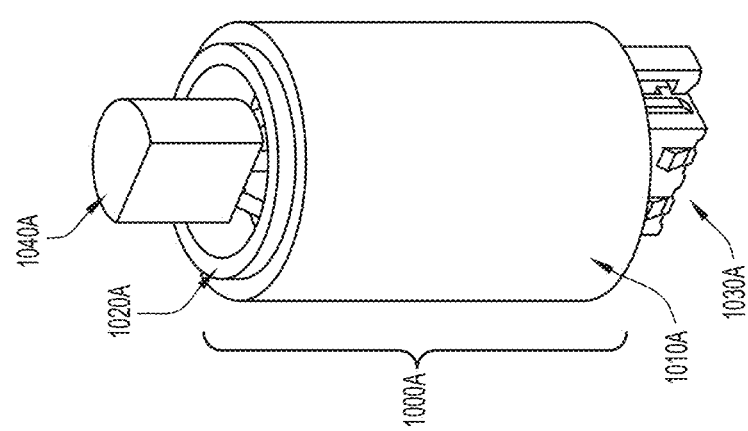

FIGS. 10A-10C illustrate respective example adjustable anchors 1000A-1000C configured to enable various degrees of freedom. With reference to FIG. 10A, adjustable anchor 1000A includes tubular members 1010A and 1020A. Tubular member 1010A is configured to attach to a PCB via female electrical connector 1030A. Tubular member 1020A is vertically displaced above tubular member 1010A, and is configured to hold environmental sensor 1040A. The degree of freedom provided by adjustable anchor 1000A is in the vertical direction, as represented by arrow 1050A. Vertical displacement may be provided via any suitable locking mechanism (e.g., (e.g., knob-and-slots, helical threads, telescopic mating, etc.).

With reference to FIG. 10B, adjustable anchor 1000B includes tubular members 1010B and 1020B. Tubular member 1010B is configured to attach to a PCB via female electrical connector 1030B. Tubular member 1020B is vertically displaced above tubular member 1010B, and is configured to hold environmental sensor 1040B. The degree of freedom provided by adjustable anchor 1000B is rotational, as represented by arrow 1050B. To this end, adjustable anchor 1000B includes a rotatable portion 1060B of tubular member 1020B. Rotatable portion 1060B is configured to rotate along an azimuthal angle relative to a plane of a printed circuit board to which adjustable anchor 1000B is attached. In one example, rotatable portion 1060B is configured to rotate at least 180 degrees (e.g., 360 degrees). In one example, rotatable portion 1060B may be a threaded tube configured to interlock with the remaining portion of tubular member 1020B. Rotatable portion 1060B may also/alternatively permit rotational movement based on friction between rotatable portion 1060B and the remaining portion of tubular member 1020B. Either embodiment (threaded tube or friction) may permit rotational movement from +180 degrees to −180 degrees while preventing rotational motion beyond +180 degrees and −180 degrees so as to avoid wire straining.

With reference to FIG. 10C, adjustable anchor 1000C includes tubular members 1010C and 1020C. Tubular member 1010C is configured to attach to a PCB via female electrical connector 1030C. Tubular member 1020C is vertically displaced above tubular member 1010C, and is configured to hold environmental sensor 1040C. The degree of freedom provided by adjustable anchor 1000C is angular translation, as represented by arrow 1050C. To this end, adjustable anchor 1000C includes a swivel portion 1060C of tubular member 1020B. Swivel portion 1060C has arms 1062C that are mounted so as to allow rotation along a polar angle relative to a plane of a printed circuit board to which adjustable anchor 1000C is attached. In one example, swivel portion 1060C is configured to rotate at least 45 degrees in either direction. Swivel movement may be achieved by frictional movement of swivel portion 1060C at one or more hinge points on tubular member 1020C. Additionally/alternatively, one or more small captive screws may lock swivel portion 1060C at a desired orientation. It will be appreciated that one or more degrees of freedom may be combined (e.g., a single adjustable anchor may permit vertical displacement, rotational translation, and/or angular translation).

Figure 11:
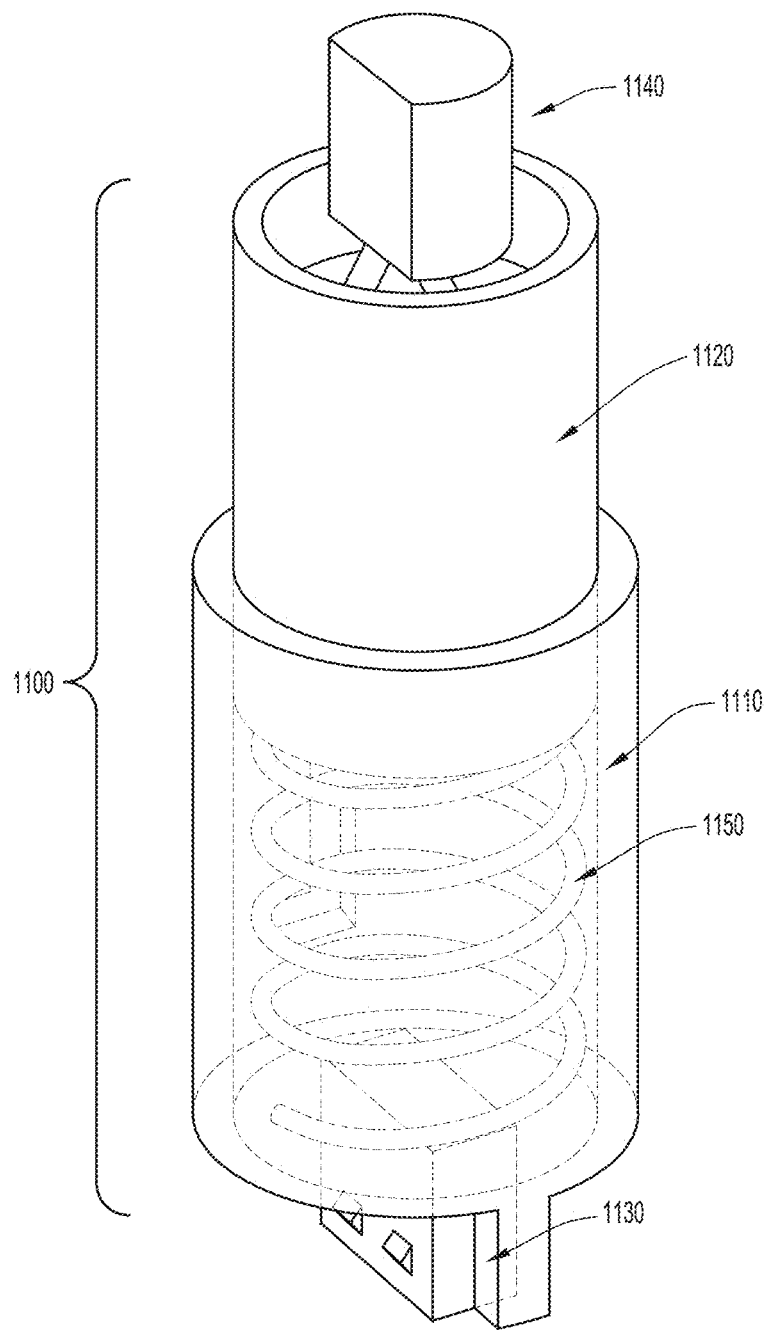
FIG. 11 illustrates an adjustable anchor including a spring that is configured to stabilize a tubular member of the adjustable anchor, according to an example embodiment.

FIG. 11 illustrates an example adjustable anchor 1100 with additional stabilization. Adjustable anchor 1100 includes tubular members 1110 and 1120. Tubular member 1110 is configured to attach to a PCB via female electrical connector 1130. Tubular member 1120 is vertically displaced above tubular member 1110, and is configured to hold environmental sensor 1140. Vertical displacement may be provided via any suitable locking mechanism (e.g., (e.g., knob-and-slots, helical threads, telescopic mating, etc.). Adjustable anchor 1100 includes spring 1150 that is configured to stabilize tubular member 1120. More specifically, tubular members 1110 may include/house spring 1150, and spring 1150 may support/elevate tubular member 1120. Spring 1150 may be helpful to absorb shocks and hold the vertical position of environmental sensor 1140.

Figure 12A:
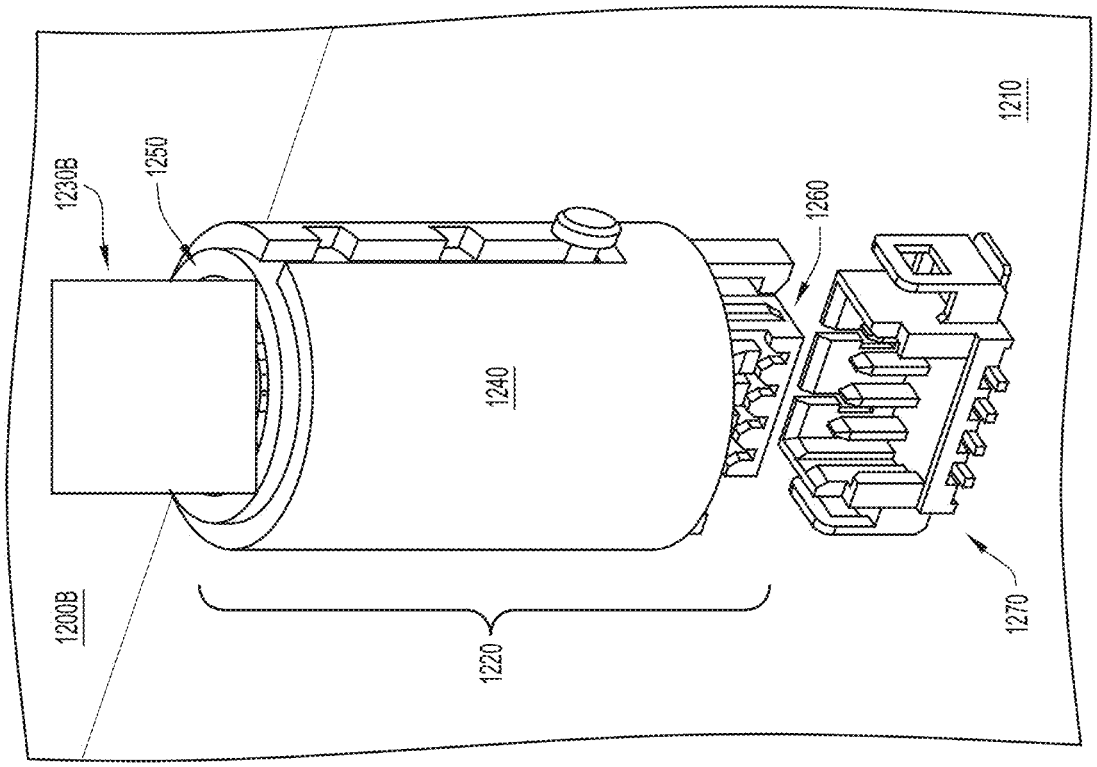
FIGS. 12A and 12B illustrates respective adjustable anchors configured with different types of environmental sensors, according to an example embodiment.
Figure 12B:
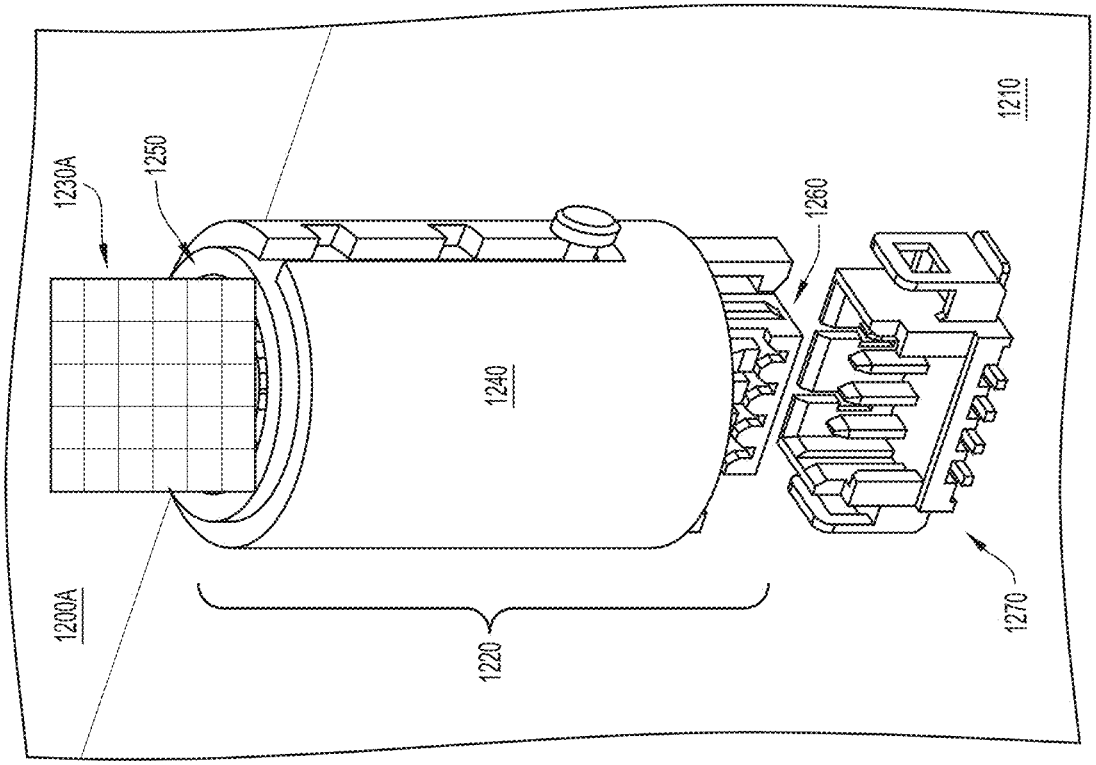

FIGS. 12A-12C illustrate respective adjustable anchors configured with different types of environmental sensors. With reference to FIG. 12A, shown is example system 1200A including PCB 1210, adjustable anchor 1220, and environmental sensor 1230A. Adjustable anchor 1220 includes tubular members 1240 and 1250. Tubular member 1240 is configured to attach to PCB 1210. Tubular member 1250 is vertically displaced above tubular member 1240, and is configured to hold environmental sensor 1230A. Tubular members 1240 and 1250 are configured to contain wires coupled to environmental sensor 1230A. The wires connect to female electrical connector 1260. PCB 1210 includes male electrical connector 1270 configured to accept female electrical connector 1260. Tubular member 1240 may snap into male electrical connector 1270 and secure adjustable anchor 1220 to PCB 1210. In this example, environmental sensor 1230A is a humidity sensor configured to collect ambient humidity data of an environment of PCB 1210.

With reference to FIG. 12B, shown is example system 1200B including PCB 1210, adjustable anchor 1220, and environmental sensor 1230B. System 1200B may be similar to system 1200A except that unlike environmental sensor 1230A, environmental sensor 1230B is a pressure sensor configured to collect ambient pressure data of the environment of PCB 1210. It will be appreciated that any suitable environmental sensor (e.g., temperature, humidity, altitude, velocity, Particulate Matter (e.g., PM2.5, PM10, etc.) gas, etc.) may be utilized in accordance with the techniques described herein. In one example, a hybrid pressure-temperature-altitude sensor may be employed. Furthermore, depending on the particular environmental sensor (or if multiple environmental sensors are used), n (e.g., 2, 4, 6, 8, 10, etc.) connector circuits may be utilized.

FIG. 13 is a flowchart of an example method 1300 for using an example adjustable anchor. At 1310, an environmental sensor for collecting data relating to an environment of a printed circuit board is attached to an adjustable anchor. The adjustable anchor includes a first tubular member having a first diameter and configured to attach to the printed circuit board and a second tubular member having a second diameter different from the first diameter and configured to hold the environmental sensor. The second tubular member is vertically adjustable relative to the first tubular member. At 1320, the adjustable anchor is attached to the printed circuit board.

The apparatus described herein may sense ambient temperature with high accuracy. The sensing point may be in the ambient environment, and may be user controlled by virtue of controlling the position (vertically, rotationally and/or angularly) of the sensor with respect to the PCB and the direction of airflow with respect to orientation of the environmental sensor. Moreover, the size of the footprint on a given PCB may be fairly small. Manufacturing costs (e.g., Bill of Materials (BOM), cost to assemble, etc.) may also be minimal as no additional accessories are required. Mounting may be a part of complete solution offered. The cost of development (e.g., thermal testing and software development times) may be minimized due to the effective temperature measurements that may be provided by the apparatus described herein. This may be a flexible solution that is diversified for other sensor applications. The apparatus may provide vertical displacement, angular translation, and/or rotational translation, and have good mechanical rigidity. The PCB assembly may involve through-holes or surface mount technology. This apparatus may take accurate temperature measurements, and the same arrangement may be used for temperature sensors, humidity sensors, pressure sensors, altitude sensors, etc.

Presented herein is an adjustable PCB anchor system for a thermal (or other) sensor. This adjustable anchor may accurately measure the ambient temperature to control system fan speed for optimal system performance. The optimal fan speed manages system operating temperatures with reduced power consumption, reduced acoustic noise, and improved system reliability. These adjustable anchors may be configured based on system requirements and have multiple degree of freedoms to customize their position by adjusting height, angle, and/or orientation against the airflow direction. The adjustable anchor may house the sensor. The adjustable anchor may attach to a PCB using surface mount technology, through-hole, and/or electrical connectors. Since the adjustable anchor is well isolated from the PCB, heat from the PCB may have less impact on the temperature (or other) sensor.

In one form, an apparatus is provided. The apparatus comprises: a first tubular member having a first diameter and configured to attach to a printed circuit board; and a second tubular member having a second diameter different from the first diameter and configured to hold an environmental sensor for collecting data relating to an environment of the printed circuit board, wherein the second tubular member is vertically adjustable relative to the first tubular member.

In one example, the first diameter is greater than the second diameter.

In one example, the first tubular member and the second tubular member are configured to contain wires coupled to the environmental sensor.

In one example, one of the first tubular member or the second tubular member includes a knob, and the other one of the first tubular member or the second tubular member includes a plurality of slots, each slot positioned vertically from the other slots and configured to receive the knob. In a further example, the first tubular member may include the plurality of slots and the second tubular member includes the knob. In another further example, at least one slot of the plurality of slots includes a flange configured to secure the knob.

In one example, the first tubular member includes a first helical thread and the second tubular member includes a second helical thread configured to mate with the first helical thread. In another example, the second tubular member is configured to telescopically mate with the first tubular member.

In one example, the second tubular member is vertically adjustable relative to the first tubular member via a motor.

In one example, the apparatus further comprises a third tubular member vertically adjustable relative to at least one of the first tubular member and the second tubular member.

In one example, the first tubular member is configured to attach to a through hole in the printed circuit board. In another example, the first tubular member is configured to attach to a surface mount on the printed circuit board.

In one example, at least a portion of the second tubular member configured to hold the environmental sensor is configured to rotate along an azimuthal angle relative to a plane of the printed circuit board. In another example, at least a portion of the second tubular member configured to hold the environmental sensor is configured to rotate along a polar angle relative to a plane of the printed circuit board.

In one example, the apparatus further comprises a spring that is configured to stabilize the second tubular member.

In one example, the environmental sensor is a temperature sensor and the data is ambient temperature data of the environment of the printed circuit board.

In another form, a method is provided. The method comprises: attaching, to an adjustable anchor, an environmental sensor for collecting data relating to an environment of a printed circuit board, the adjustable anchor including a first tubular member having a first diameter and configured to attach to the printed circuit board and a second tubular member having a second diameter different from the first diameter and configured to hold the environmental sensor, wherein the second tubular member is vertically adjustable relative to the first tubular member; and attaching the adjustable anchor to the printed circuit board.

In another form, a system is provided. The system comprises: a printed circuit board; an environmental sensor for collecting data relating to an environment of the printed circuit board; and an adjustable anchor including: a first tubular member having a first diameter and configured to attach to the printed circuit board; and a second tubular member having a second diameter different from the first diameter and configured to hold the environmental sensor, wherein the second tubular member is vertically adjustable relative to the first tubular member.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. An apparatus comprising:
   a first tubular member having a first diameter and configured to attach to a printed circuit board via a surface mount on the printed circuit board that includes one or more tabs which define one or more holes, wherein the first tubular member includes one or more outward-facing hook members configured to snap into the one or more holes defined by the one or more tabs; and
   a second tubular member having a second diameter different from the first diameter and configured to hold an environmental sensor for collecting data relating to an environment of the printed circuit board, wherein at least a portion of the second tubular member is configured to rotate.

2. The apparatus of claim 1, wherein the first diameter is greater than the second diameter.

3. The apparatus of claim 1, wherein the first tubular member and the second tubular member are configured to contain wires coupled to the environmental sensor.

4. The apparatus of claim 1, wherein the at least the portion of the second tubular member is configured to permit a rotational motion of at least 180 degrees.

5. The apparatus of claim 1, wherein the at least the portion of the second tubular member is configured to prevent a rotational motion beyond 360 degrees.

6. The apparatus of claim 1, wherein the at least the portion of the second tubular member is further configured to swivel.

7. The apparatus of claim 6, wherein the at least the portion of the second tubular member includes one or more arms configured to permit a swivel motion.

8. The apparatus of claim 6, wherein the at least the portion of the second tubular member is configured to swivel approximately 90 degrees.

9. The apparatus of claim 6, wherein the at least the portion of the second tubular member is configured to lock at one or more angles.

10. The apparatus of claim 1, wherein the environmental sensor is a temperature sensor and the data is ambient temperature data of the environment of the printed circuit board.

11. A method comprising:
    attaching, to an adjustable anchor, an environmental sensor for collecting data relating to an environment of a printed circuit board, the adjustable anchor including a first tubular member having a first diameter and configured to attach to the printed circuit board via a surface mount on the printed circuit board that includes one or more tabs which define one or more holes, wherein the first tubular member includes one or more outward-facing hook members configured to snap into the one or more holes defined by the one or more tabs, and a second tubular member having a second diameter different from the first diameter and configured to hold the environmental sensor, wherein at least a portion of the second tubular member is configured to rotate and/or swivel; and
    attaching the adjustable anchor to the printed circuit board.

12. The method of claim 11, wherein attaching the environmental sensor configured to collect the data relating to the environment of the printed circuit board includes:
    attaching a temperature sensor for collecting ambient temperature data of the environment of the printed circuit board.

13. The method of claim 11, wherein the at least the portion of the second tubular member includes one or more arms configured to permit a swivel motion.

14. The method of claim 11, wherein the at least the portion of the second tubular member is configured to swivel approximately 90 degrees.

15. The method of claim 11, wherein the at least the portion of the second tubular member is configured to lock at one or more angles.

16. The method of claim 11, wherein the at least the portion of the second tubular member is configured to permit a rotational motion of at least 180 degrees.

17. The method of claim 11, wherein the at least the portion of the second tubular member is configured to prevent a rotational motion beyond 360 degrees.

18. A system comprising:
    a printed circuit board;
    an environmental sensor configured to collect data relating to an environment of the printed circuit board; and
    an adjustable anchor including:
      a first tubular member having a first diameter and configured to attach to the printed circuit board via a surface mount on the printed circuit board that includes one or more tabs which define one or more holes, wherein the first tubular member includes one or more outward-facing hook members configured to snap into the one or more holes defined by the one or more tabs; and
      a second tubular member having a second diameter different from the first diameter and configured to hold the environmental sensor, wherein at least a portion of the second tubular member is configured to rotate and/or swivel.

19. The system of claim 18, wherein the first diameter is greater than the second diameter.

20. The system of claim 18, wherein the environmental sensor is a temperature sensor and the data is ambient temperature data of the environment of the printed circuit board.

21. The system of claim 18, wherein the at least the portion of the second tubular member includes one or more arms configured to permit a swivel motion.

22. The system of claim 18, wherein the at least the portion of the second tubular member is configured to swivel approximately 90 degrees.

23. The system of claim 18, wherein the at least the portion of the second tubular member is configured to lock at one or more angles.

24. The system of claim 18, wherein the at least the portion of the second tubular member is configured to permit a rotational motion of at least 180 degrees.

25. The system of claim 18, wherein the at least the portion of the second tubular member is configured to prevent a rotational motion beyond 360 degrees.

26. An apparatus comprising:
a first tubular member having a first diameter and configured to attach to a printed circuit board via a surface mount on the printed circuit board that includes one or more tabs which define one or more holes, wherein the first tubular member includes one or more outward-facing hook members configured to snap into the one or more holes defined by the one or more tabs; and
a second tubular member having a second diameter different from the first diameter and configured to hold an environmental sensor for collecting data relating to an environment of the printed circuit board, wherein at least a portion of the second tubular member is configured to swivel.

27. The apparatus of claim 26, wherein the at least the portion of the second tubular member includes one or more arms configured to permit a swivel motion.

28. The apparatus of claim 26, wherein the at least the portion of the second tubular member is configured to swivel approximately 90 degrees.

29. The apparatus of claim 26, wherein the at least the portion of the second tubular member is configured to lock at one or more angles.

30. The apparatus of claim 26, wherein the at least the portion of the second tubular member is further configured to rotate.

31. The apparatus of claim 30, wherein the at least the portion of the second tubular member is configured to permit a rotational motion of at least 180 degrees.

32. The apparatus of claim 30, wherein the at least the portion of the second tubular member is configured to prevent a rotational motion beyond 360 degrees.

* * * * *